(12) United States Patent
Hashiguchi et al.

(10) Patent No.: US 12,431,319 B2
(45) Date of Patent: Sep. 30, 2025

(54) CHARGED PARTICLE BEAM DEVICE AND IMAGE GENERATION METHOD

(71) Applicant: JEOL Ltd., Tokyo (JP)

(72) Inventors: Hiroki Hashiguchi, Tokyo (JP); Kazuki Yagi, Tokyo (JP); Ruth Shewmon Bloom, Oakland, CA (US); Bryan W. Reed, San Leandro, CA (US)

(73) Assignee: JEOL Ltd., Tokyo (JP)

( * ) Notice: Subject to any disclaimer, the term of this patent is extended or adjusted under 35 U.S.C. 154(b) by 416 days.

(21) Appl. No.: 17/939,309

(22) Filed: Sep. 7, 2022

(65) Prior Publication Data

US 2023/0072991 A1  Mar. 9, 2023

(30) Foreign Application Priority Data

Sep. 8, 2021 (JP) ................. 2021-146210

(51) Int. Cl.
*H01J 37/04* (2006.01)
*G01N 23/04* (2018.01)
(Continued)

(52) U.S. Cl.
CPC ............ *H01J 37/045* (2013.01); *G01N 23/04* (2013.01); *H01J 37/00* (2013.01); *H01J 37/28* (2013.01)

(58) Field of Classification Search
CPC .. H01J 37/00; H01J 37/02; H01J 37/26; H01J 37/28; H01J 37/045; H01J 37/222;
(Continued)

(56) References Cited

U.S. PATENT DOCUMENTS 6,538,249 B1 * 3/2003 Takane ............... G06T 5/50
850/10
2002/0008207 A1 1/2002 Muraki et al.
(Continued)

FOREIGN PATENT DOCUMENTS

JP   2001168017 A   6/2001
JP    201358363 A   3/2013

OTHER PUBLICATIONS

Extended European Search Report issued in EP22193635.4 on Feb. 2, 2023.
Office Action issued in JP2021146210 on Oct. 17, 2023.

*Primary Examiner* — Jason L McCormack
(74) *Attorney, Agent, or Firm* — The Webb Law Firm (57) ABSTRACT

A charged particle beam device scans a specimen with a charged particle beam and generates an image based on a detected signal from a detector that detects a signal generated from the specimen based on the scan performed by the charged particle beam. The charged particle beam device includes: a blanker that performs blanking of the charged particle beam; an image acquisition unit that acquires a plurality of images by controlling the blanking during the scan performed by the charged particle beam, the plurality of images including pixels corresponding to a region of the specimen that is irradiated with the charged particle beam and pixels corresponding to a region of the specimen that is not irradiated with the charged particle beam; and an integrated image generation unit that generates an integrated image by integrating the plurality of acquired images.

6 Claims, 5 Drawing Sheets

(51) Int. Cl.
   *H01J 37/00*   (2006.01)
   *H01J 37/28*   (2006.01)
(58) Field of Classification Search
   CPC ......... H01J 2237/043; H01J 2237/2802; H01J 2237/2803; G01N 23/04
   USPC ............................... 250/306, 307, 310, 311
   See application file for complete search history.

(56) References Cited

U.S. PATENT DOCUMENTS

| | | | | |
|---|---|---|---|---|
| 2009/0001279 | A1* | 1/2009 | Kobaru | H01J 37/28 250/396 R |
| 2009/0026912 | A1* | 1/2009 | Lordi | H01J 37/063 250/492.23 |
| 2020/0211820 | A1* | 7/2020 | Lyons | H01J 37/045 |
| 2021/0020422 | A1* | 1/2021 | Nakamura | H01J 37/265 |

* cited by examiner

CHARGED PARTICLE BEAM DEVICE AND IMAGE GENERATION METHOD

CROSS-REFERENCE TO RELATED APPLICATION

This application claims priority to Japanese Patent Application No. 2021-146210, filed Sep. 8, 2021, the disclosure of which is hereby incorporated by reference in its entirety.

BACKGROUND OF THE INVENTION

Field of the Invention

The present invention relates to a charged particle beam device and an image generation method.

Description of Related Art

In a STEM mode, the Z contrast is acquired by ADF (annular dark field), and since image interpretation is intuitive, a structure can be ascertained more easily than in a TEM mode. Further, since position information is also acquired, data can be extracted for each pixel instead of average information such as that acquired in the TEM mode by combining the acquired position information with analysis such as EDS. In general, therefore, the STEM mode has recently come to be used exclusively (JP-A-2013-058363).

In a normal scanning method, however, a scan is performed by applying a narrowed electron beam from left to right, and therefore the electron beam applied to one pixel (a region of a specimen corresponding to one pixel on an image) has a high current density. As a result, electron beam damage is typically larger in the STEM mode than in the TEM mode, making it difficult to observe and analyze the specimen.

SUMMARY OF THE INVENTION

The invention can provide a charged particle beam device and an image generation method with which it is possible to reduce damage received by a specimen when irradiated with a charged particle beam.

According to a first aspect of the invention there is provided a charged particle beam device that scans a specimen with a charged particle beam and generates an image based on a detected signal from a detector that detects a signal generated from the specimen based on the scan performed by the charged particle beam, the charged particle beam device including:
  a blanker that performs blanking of the charged particle beam;
  an image acquisition unit that acquires a plurality of images by controlling the blanking during the scan performed by the charged particle beam, the plurality of images including pixels corresponding to a region of the specimen that is irradiated with the charged particle beam and pixels corresponding to a region of the specimen that is not irradiated with the charged particle beam; and
  an integrated image generation unit that generates an integrated image by integrating the plurality of acquired images.

According to a second aspect of the invention, there is provided an image generation method for scanning a specimen with a charged particle beam and generating an image based on a detected signal from a detector that detects a signal generated from the specimen based on the scan performed by the charged particle beam, the image generation method including:
  an image acquisition step of acquiring a plurality of images by controlling blanking performed on the charged particle beam by a blanker during the scan performed by the charged particle beam, the plurality of imaged including pixels corresponding to a region of the specimen that is irradiated with the charged particle beam and pixels corresponding to a region of the specimen that is not irradiated with the charged particle beam; and
  an integrated image generating step of generating an integrated image by integrating the plurality of acquired images.

DESCRIPTION OF THE INVENTION (1) According to an embodiment of the invention, there is provided a charged particle beam device that scans a specimen with a charged particle beam and generates an image based on a detected signal from a detector that detects a signal generated from the specimen based on the scan performed by the charged particle beam, the charged particle beam device including:
  a blanker that performs blanking of the charged particle beam;
  an image acquisition unit that acquires a plurality of images by controlling the blanking during the scan performed by the charged particle beam, the plurality of images including pixels corresponding to a region of the specimen that is irradiated with the charged particle beam and pixels corresponding to a region of the specimen that is not irradiated with the charged particle beam; and
  an integrated image generation unit that generates an integrated image by integrating the plurality of acquired images.

Further, according to an embodiment of the invention, there is provided an image generation method for scanning a specimen with a charged particle beam and generating an image based on a detected signal from a detector that detects a signal generated from the specimen based on the scan performed by the charged particle beam, the image generation method including:
  an image acquisition step of acquiring a plurality of images by controlling blanking performed on the charged particle beam by a blanker during the scan performed by the charged particle beam, the plurality of images including pixels corresponding to a region of the specimen that is irradiated with the charged particle beam and pixels corresponding to a region of the specimen that is not irradiated with the charged particle beam; and an integrated image generating step of generating an integrated image by integrating the plurality of acquired images.

According to the above embodiments, an image including pixels corresponding to a region (an irradiated region) that is irradiated with the charged particle beam and pixels corresponding to a region (a non-irradiated region) that is not irradiated with the charged particle beam is acquired by controlling blanking during the scan performed by the charged particle beam, and therefore the non-irradiated region serves as an escape route for heat and charge generated in the irradiated region, whereby the heat and charge are diffused. As a result, damage received by the specimen when irradiated with the charged particle beam can be reduced.

(2) In the charged particle beam device described above, the image acquisition unit may control the blanking for each pixel.

In the image generation method described above, the blanking may be controlled for each pixel in the image acquisition step.

(3) In the charged particle beam device described above, the image acquisition unit may control the blanking randomly for each pixel.

In the image generation method described above, the blanking may be controlled randomly for each pixel in the image acquisition step.

(4) In the charged particle beam device described above, the image acquisition unit may acquire a plurality of images including: regions of the plurality of images corresponding to different regions of the specimen that are irradiated with the charged particle beam; and regions of the plurality of images corresponding to different regions of the specimen that are not irradiated with the charged particle beam.

In the image generation method described above, the image acquisition step may acquire a plurality of images including: regions of the plurality of images corresponding to different regions of the specimen that are irradiated with the charged particle beam; and regions of the plurality of images corresponding to different regions of the specimen that are not irradiated with the charged particle beam.

(5) In the charged particle beam device or in the image generation method described above, the blanker may be an electrostatic shutter.

(6) In the charged particle beam device described above, the image acquisition unit may increase a dose of the charged particle beam used when acquiring the plurality of images in proportion to the number of images to be acquired.

In the image generation method described above, a dose of the charged particle beam used when acquiring the plurality of images in the image acquiring step may be increased in proportion to the number of images to be acquired.

Preferred embodiments of the invention will be described in detail below with reference to the drawings. It is noted that the following embodiments do not unduly limit the scope of the invention as stated in the claims. In addition, all of the components described below are not necessarily essential requirements of the invention.

1. Configuration

Figure 1:
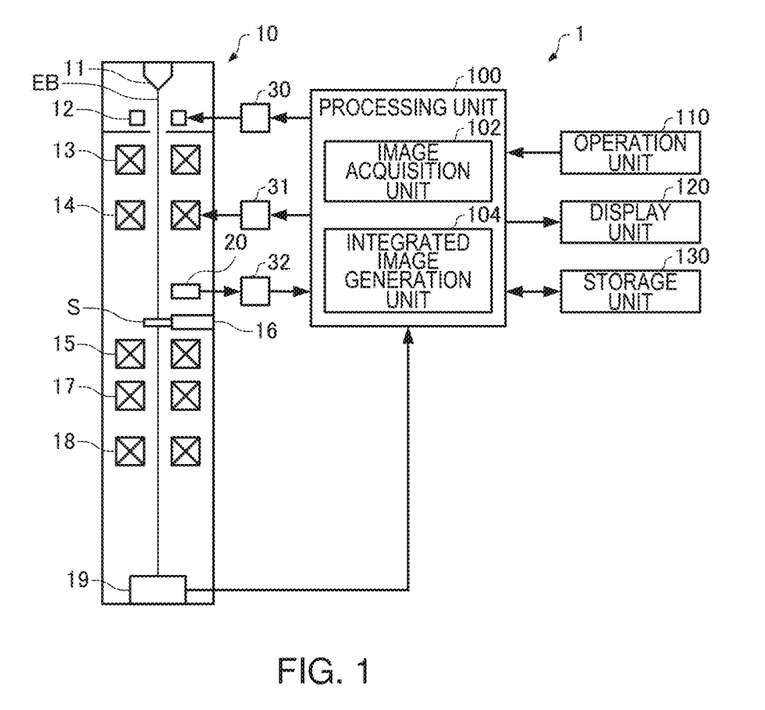
FIG. 1 is a diagram illustrating an example of configuration of a charged particle beam device according to an embodiment of the invention.

FIG. 1 is a diagram illustrating an example of configuration of a charged particle beam device (an electron microscope) according to an embodiment of the invention. Here, a case in which the charged particle beam device has the configuration of a scanning transmission electron microscope (a STEM) will be described, but the charged particle beam device according to the invention may have the configuration of a scanning electron microscope (a SEM) or a focused ion-beam device (an FIB) instead. Furthermore, here, a case in which the electron microscope includes an energy-dispersive X-ray spectrometer (an EDS or an EDX) as an analysis device will be described, but instead, the electron microscope may include an electron energy-loss spectrometer (EELS) as an analysis device or may be formed without an analysis device. Note that the electron microscope of this embodiment may have a configuration from which some of the constituent elements (units) in FIG. 1 have been omitted.

As illustrated in FIG. 1, an electron microscope 1 includes an electron microscope main body 10, a processing unit 100, an operation unit 110, a display unit 120, and a storage unit 130.

The electron microscope main body 10 includes an electron beam source 11, a blanker 12, a condenser lens 13, a scan deflector 14, an objective lens 15, a specimen stage 16, an intermediate lens 17, a projection lens 18, a transmitted electron detector 19, an EDS detector 20, a blanker control device 30, a deflector control device 31, and a multichannel pulse height analyzer 32.

The electron beam source 11 generates an electron beam EB (an example of a charged particle beam). The electron beam source 11 accelerates electrons discharged from a cathode using an anode, and discharges the electron beam EB. An electron gun, for example, can be used as the electron beam source 11.

The blanker 12 is disposed to the rear of the electron beam source 11 (on the downstream side of the electron beam EB). The blanker 12 performs blanking on the electron beam EB. An electrostatic shutter (an electrostatic deflector) is used as the blanker 12. An electrostatic shutter is compatible with a μs or ns order scan such as that performed by a STEM, and can be switched ON and OFF at high speed. The blanker 12 is controlled by the blanker control device 30. The blanker control device 30 controls the blanker 12 based on a control signal generated by the processing unit 100.

The condenser lens 13 is disposed to the rear of the blanker 12. The condenser lens 13 is a lens for focusing the electron beam EB generated by the electron beam source 11 and irradiating a specimen S therewith. The condenser lens 13 may be configured to include a plurality of lenses.

The scan deflector 14 is disposed to the rear of the condenser lens 13. The scan deflector 14 deflects the electron beam EB and scans the specimen S with the electron beam EB (an electron probe) focused by the condenser lens 13 and the objective lens 15. The scan deflector 14 includes a deflection coil for deflecting the electron beam EB. The scan deflector 14 is controlled by the deflector control device 31. The deflector control device 31 controls the scan deflector 14 based on a control signal generated by the processing unit 100.

The objective lens 15 is disposed to the rear of the scan deflector 14 (the scanning coil). The objective lens 15 is a lens for focusing the electron beam EB and irradiating the specimen S therewith.

The specimen stage 16 holds the specimen S. The specimen stage 16 holds the specimen S via a specimen holder (not shown). The specimen stage 16 can position the specimen S by moving and stopping the specimen holder. The specimen stage 16 is controlled by a stage control device (not shown), and can move the specimen S in a horizontal direction (a direction orthogonal to the advancement direction of the electron beam EB) and a vertical direction (a direction extending along the advancement direction of the electron beam EB).

The intermediate lens 17 is disposed to the rear of the objective lens 15. The projection lens 18 is disposed to the rear of the intermediate lens 17. The intermediate lens 17 and the projection lens 18 guide the electron beam EB transmitted through the specimen S to the transmitted electron detector 19. For example, the intermediate lens 17 and the projection lens 18 form an image on the transmitted electron detector 19 by projecting an image plane or a back focal plane (the plane on which a diffraction pattern is formed) of the objective lens 15.

The transmitted electron detector 19 is disposed to the rear of the projection lens 18. The transmitted electron detector 19 detects the electrons transmitted through the specimen S.

The EDS detector 20 detects characteristic X-rays generated from the specimen S as a result of being irradiated with the electron beam EB. A silicon drift detector (SDD), an Si (Li) detector, or the like, for example, can be used as the EDS detector 20. An output signal (an output pulse) from the EDS detector 20 is transmitted to the multichannel pulse height analyzer 32.

The multichannel pulse height analyzer 32 (a multichannel analyzer) is a pulse height analyzer having a plurality of channels. The multichannel pulse height analyzer 32 generates EDS spectrum information by counting output signals (output pulses) from the EDS detector 20 in X-ray energy units. The multichannel pulse height analyzer 32 outputs the EDS spectrum information to the processing unit 100.

The operation unit 110 is used by a user to input operation information, and the input operation information is output to the processing unit 100. The functions of the operation unit 110 can be realized by hardware such as a keyboard, a mouse, buttons, a touch panel, and so on.

The display unit 120 is used to display an image generated by the processing unit 100, and the functions thereof can be realized by an LCD, a CRT, a touch panel that also functions as the operation unit 110, and so on.

The storage unit 130 stores a program for causing a computer to function as respective units of the processing unit 100, as well as various data. The storage unit 130 functions as a working area of the processing unit 100, and the functions thereof can be realized by a hard disk, a RAM, or the like.

The processing unit 100 performs processing for controlling the blanker control device 30, the deflector control device 31, the stage control device, and so on, processing for acquiring an electron microscope image (a scanning transmission electron microscope image) or an elemental mapping image, and so on. The functions of the processing unit 100 can be realized by hardware such as various types of processors (a CPU, a DSP, or the like), or a program. The processing unit 100 includes an image acquisition unit 102 and an integrated image generation unit 104.

The image acquisition unit 102 acquires an electron microscope image by synchronizing the detection signal output by the transmitted electron detector 19 with a scanning signal and visualizing the result. Further, the image acquisition unit 102 determines a spectrum (an EDS spectrum) of each of the pixels corresponding to a scanning region of the electron beam EB based on the EDS spectrum information output by the multichannel pulse height analyzer 32 and the scanning signal, and acquires an elemental mapping image mapping the integrated strength of a specific energy range (an ROI) based on the spectrum of each pixel.

More specifically, the image acquisition unit 102 of this embodiment acquires a plurality of images (incomplete electron microscope images or elemental mapping images including pixels corresponding to a non-irradiated region) constituted by pixels corresponding to a region (referred to hereinafter as an irradiated region) irradiated with the electron beam EB and pixels corresponding to a region (referred to hereinafter as the non-irradiated region) not irradiated with the electron beam EB by controlling blanking by the blanker 12 for each pixel during the scan performed using the electron beam EB, whereupon the integrated image generation unit 104 acquires an integrated image (a single electron microscope image or elemental mapping image) by integrating the plurality of images acquired by the image acquisition unit 102. The plurality of images acquired by the image acquisition unit 102 are a plurality of images on which regions of the images corresponding to the irradiated region at least partially differ from each other and regions of the images corresponding to the non-irradiated region at least partially differ from each other. The image acquisition unit 102 may also control the electron beam source 11 so as to increase the dose of the electron beam EB during acquisition of the images in proportion to the number of acquired images.

2. Methods Used in Embodiments

Next, methods used in the embodiments of the invention will be described below with reference to the drawings.

2-1. First Embodiment

Figure 2:
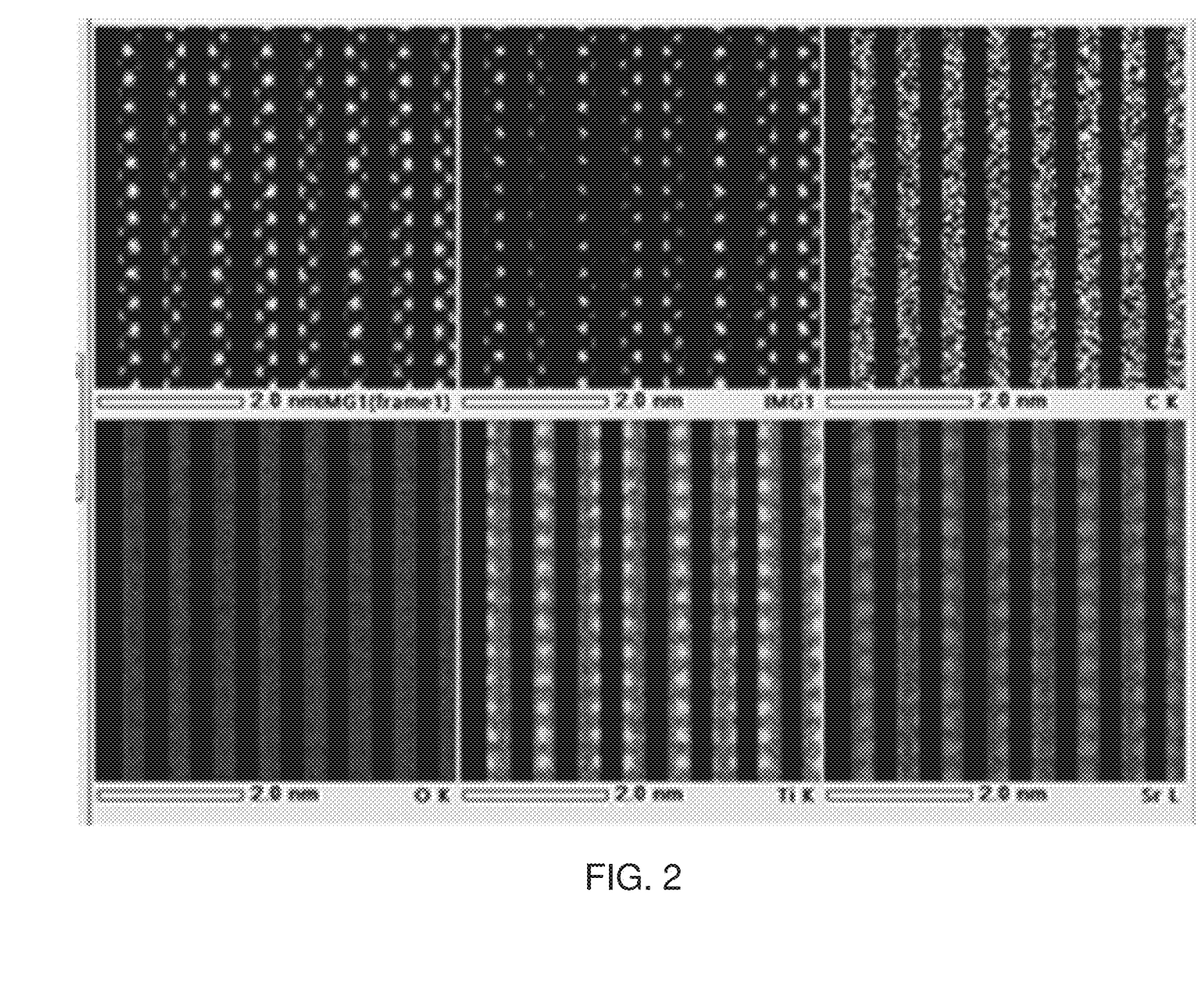
FIG. 2 illustrates examples of images acquired in the first embodiment.

In the first embodiment, the image acquisition unit 102 acquires an image on which image regions corresponding to the irradiated region of the specimen S and image regions corresponding to the non-irradiated region of the specimen S are arranged alternately in a horizontal direction (a main scanning direction) so that stripes are formed in a vertical direction (a sub-scanning direction). FIG. 2 illustrates examples of images (incomplete electron microscope images and elemental mapping images) acquired in the first embodiment. On each of the images in FIG. 2, the regions (pixel groups) corresponding to the non-irradiated region are rectangular regions in which the brightness extending in the vertical direction is 0 (black).

More specifically, a TTL signal (or a pixel clock) is synchronized with the scanning signal, and the irradiated region and non-irradiated region are set in relation to a plurality of pixels within one horizontal scanning line. For example, when the pixel dwell time (the time that the electron beam EB remains on each pixel; the dwell time) of the electron beam EB is set at 10 μs, the ON/OFF timing of blanking is set at 20 μs, and the duty ratio is set at ½, a setting by which irradiation and non-irradiation are performed for each pixel (a setting by which blanking is switched ON/OFF for each pixel) is realized, whereby an image on which a region having a width of one pixel and corresponding to the irradiated region and a region having a width of one pixel and corresponding to the non-irradiated region are arranged alternately in the horizontal direction is acquired. Alternatively, when the pixel dwell time of the electron beam EB is set at 10 μs, the ON/OFF timing of blanking is set at 40 μs, and the duty ratio is set at ½, a setting by which blanking is switched ON/OFF for every two pixels is realized, whereby an image on which a region having a width of two pixels and corresponding to the irradiated region and a region having a width of two pixels and corresponding to the non-irradiated region are arranged alternately in the horizontal direction is acquired. Note that the images in FIG. 2 are images acquired by performing scanning under a setting by which blanking is switched ON/OFF in units of a plurality of pixels. Alternatively, when the pixel dwell time of the electron beam EB is set at 10 µs, the ON/OFF timing of blanking is set at 30 µs, and the duty ratio is set at ⅓, a setting by which one of three adjacent pixels in the horizontal direction is irradiated while the remaining two pixels are not irradiated is realized, whereby an image on which a region having a width of one pixel and corresponding to the irradiated region and a region having a width of two pixels and corresponding to the non-irradiated region are arranged alternately in the horizontal direction is acquired. By performing scanning while switching blanking ON/OFF in units of one or a plurality of pixels in this manner, the electron beam EB generates heat and charge in the irradiated region, but since the region adjacent to the irradiated region in the horizontal direction is not irradiated with the electron beam EB, the heat and charge have an escape route (the heat and charge are diffused), and as a result, damage received by the specimen S when irradiated with the electron beam EB can be reduced.

Figure 3:
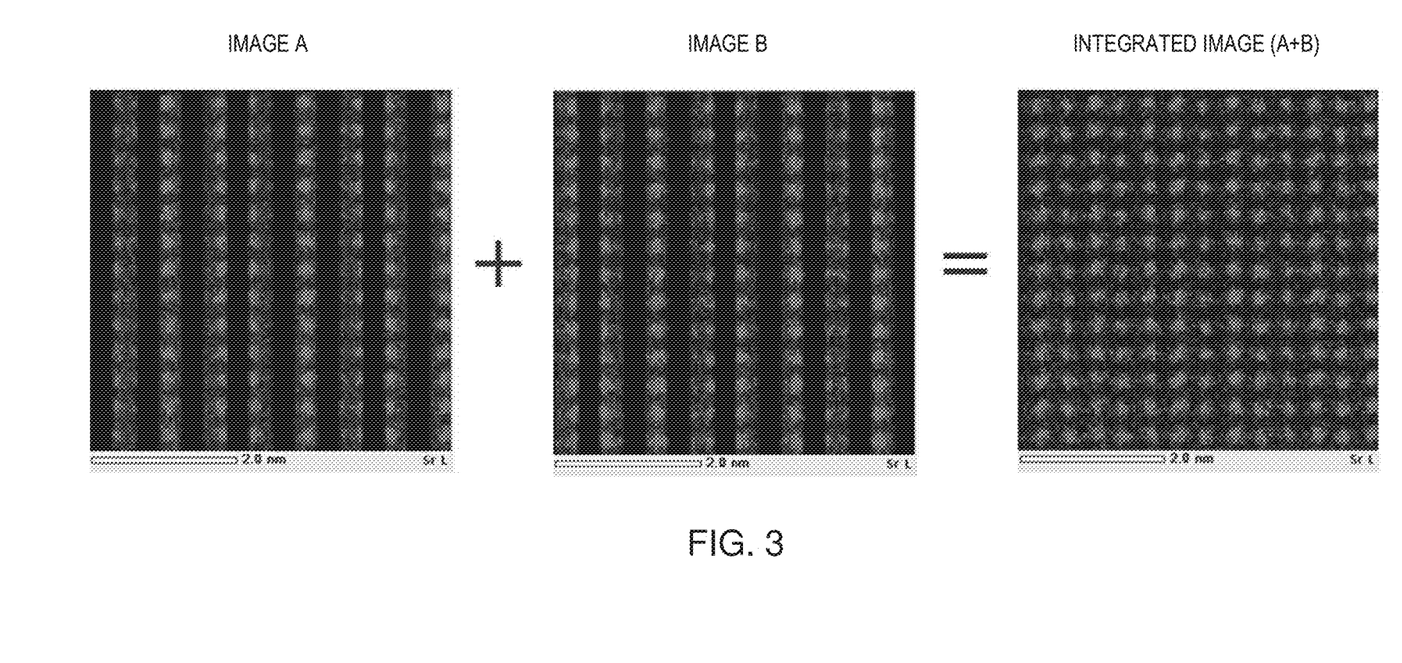
FIG. 3 illustrates an example of integration of a plurality of images acquired in the first embodiment.

A plurality of images of this type are acquired while varying the irradiated region. More specifically, a plurality of images on which the image regions corresponding to the irradiated region do not overlap each other and the image regions corresponding to the non-irradiated region differ from each other are acquired. An integrated image (a single electron microscope image or elemental mapping image) is then generated by integrating the plurality of acquired images. In an example in FIG. 3, an integrated image (a single elemental mapping image) is generated by integrating an image A acquired by performing a scan under a setting in which blanking is switched ON/OFF in units of a plurality of pixels and an image B acquired by performing a scan for the same time under a setting in which the irradiated region and non-irradiated region differ from those of the image A (the irradiated region and the non-irradiated region are switched).

Note that a method of acquiring two images under a setting in which blanking is switched ON/OFF in units of one or a plurality of pixels requires twice the time of a conventional method (a method in which a non-irradiated region is not set). Hence, in order to acquire a similar throughput to that of a conventional method, twice the dose (amount of current) is required. Further, with a setting by which one of three adjacent pixels in the horizontal direction is irradiated while the remaining two pixels are not irradiated, for example, it is necessary to acquire three images, and therefore, in order to acquire a similar throughput to that of a conventional method, three times the dose is required. In other words, in order to acquire a similar throughput to that of a conventional method, the dose of the electron beam EB must be increased in proportion to the number of acquired (integrated) images.

Figure 4:
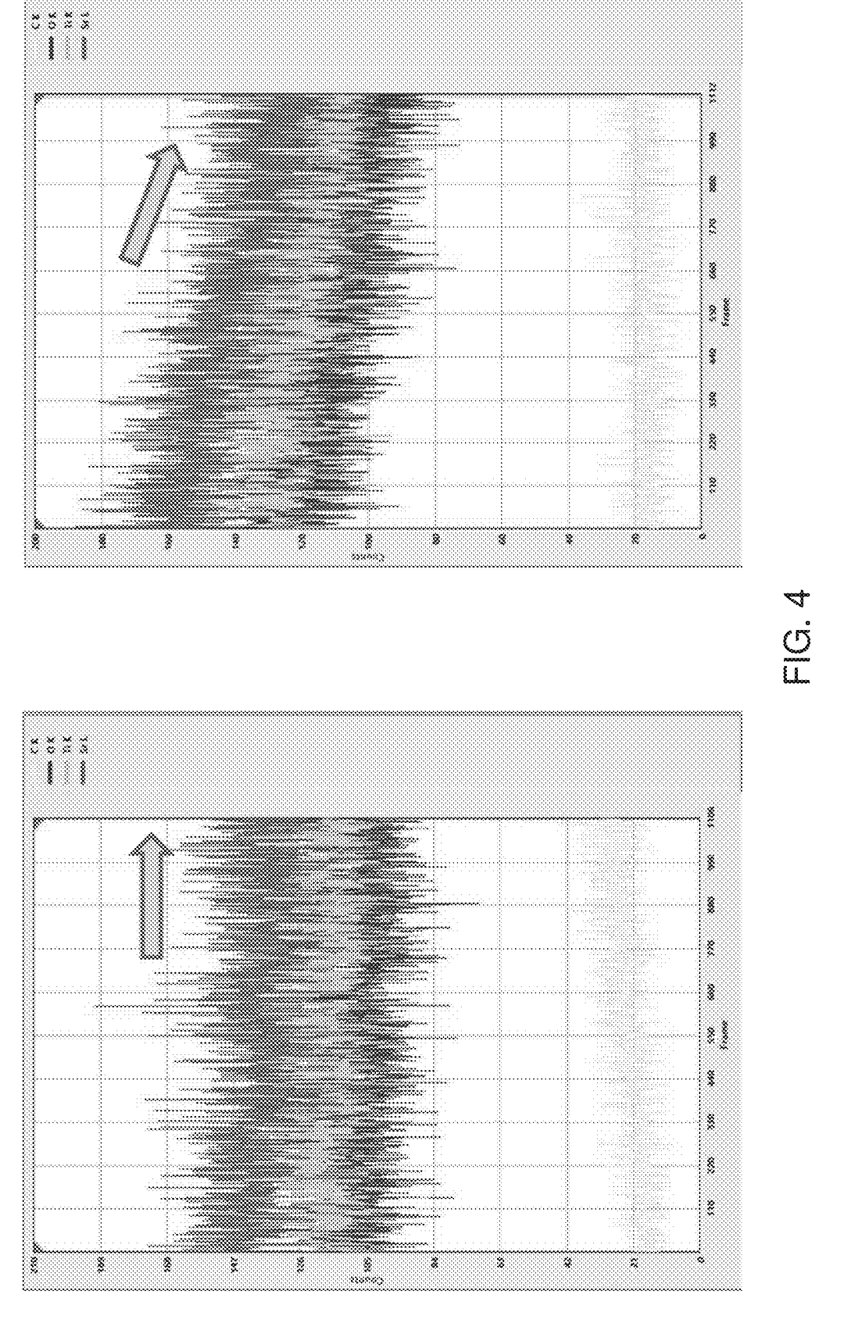
FIG. 4 illustrates results of standardizing and comparing X-ray counts between the method of the first embodiment and a conventional method.

The X-ray count (the count value of the output of the EDS detector 20) was standardized and compared between a method of performing a scan under a setting in which blanking is switched ON/OFF in units of one or a plurality of pixels (i.e., the method of this embodiment) and a conventional method. Strontium titanate was used as the specimen S. Further, in the method of this embodiment, the dose of the electron beam EB was set at approximately 1.9 times that of the conventional method. FIG. 4 illustrates the comparison result. A graph on the left side of the figure illustrates the X-ray count per frame according to the method of this embodiment, and a graph on the right side illustrates the X-ray count per frame according to the conventional method. On the graph on the left side, the X-ray count remains substantially unchanged even as the number of frames increases, and it may therefore be assumed that the specimen S is not damaged. On the graph on the right side, however, the X-ray count decreases as the number of frames increases, and it may therefore be assumed that the specimen S is damaged. Hence, it was confirmed that with the method of this embodiment, damage to the specimen S can be reduced even when the dose is increased in order to acquire a similar throughput to that of a conventional method.

2-2. Second Embodiment

Figure 5:
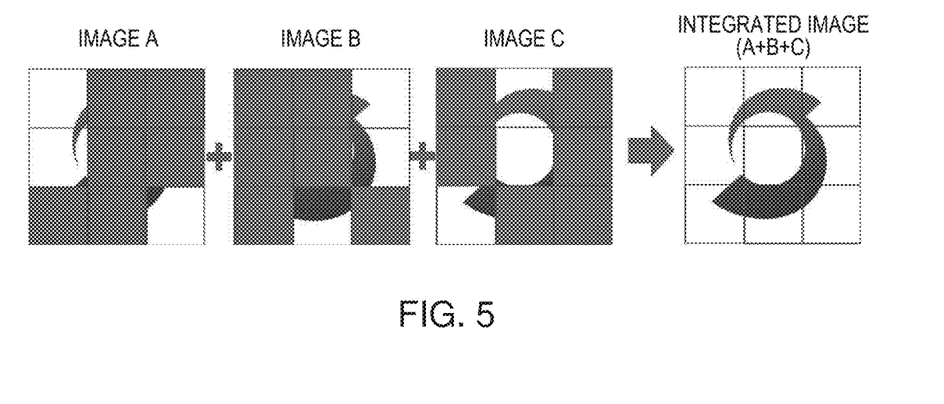
FIG. 5 illustrates an example of integration of a plurality of images acquired in the second embodiment.

In the second embodiment, the image acquisition unit 102 acquires a plurality of images on which pixels corresponding to the irradiated region and pixels corresponding to the non-irradiated region are arranged randomly (pseudo-randomly). More specifically, during the scan performed by the electron beam EB, blanking is switched ON/OFF randomly for each pixel (the irradiated region and the non-irradiated region are set randomly in relation to the plurality of pixels in the scanning region). An integrated image is then generated by integrating the plurality of acquired images. In an example in FIG. 5, an integrated image is generated by integrating three images A, B, and C acquired by controlling blanking randomly in relation to each pixel during the scan. On the images A, B, and C in FIG. 5, rectangular regions shaded gray denote the pixels corresponding to the non-irradiated region, while the other rectangular regions denote the pixels corresponding to the irradiated region. In the example in FIG. 5, the three images are acquired by controlling blanking for each pixel so that one in three pixels is irradiated randomly and so that the pixels corresponding to the irradiated region do not overlap between the images, but blanking may be controlled randomly for each pixel while allowing the pixels corresponding to the irradiated region to overlap between the images. Further, the irradiation ratio may be 1/n (where n is an integer of 2 or more) or another ratio. Furthermore, blanking may be controlled so that pixels corresponding to the irradiated region are not adjacent (continuous) on the image.

In the method of the first embodiment, the heat and charge generated in the irradiated region only escape from the region adjacent to the irradiated region in the horizontal direction, but with the method of the second embodiment, regions from which the heat and charge escape can also be formed in a vertical direction or a diagonal direction relative to the irradiated region, and it may therefore be possible to further reduce damage to the specimen S.

Moreover, with a method in which a plurality of images are acquired by controlling blanking randomly for each pixel (for example, when n images are acquired by performing control such that one in n pixels is irradiated randomly), in order to acquire a similar throughput to that of a conventional method, the dose of the electron beam EB must be increased in proportion to the number of acquired images, but similarly to the method of the first embodiment, it is thought that damage to the specimen S can be reduced even when the dose is increased.

3. Processing

Figure 6:
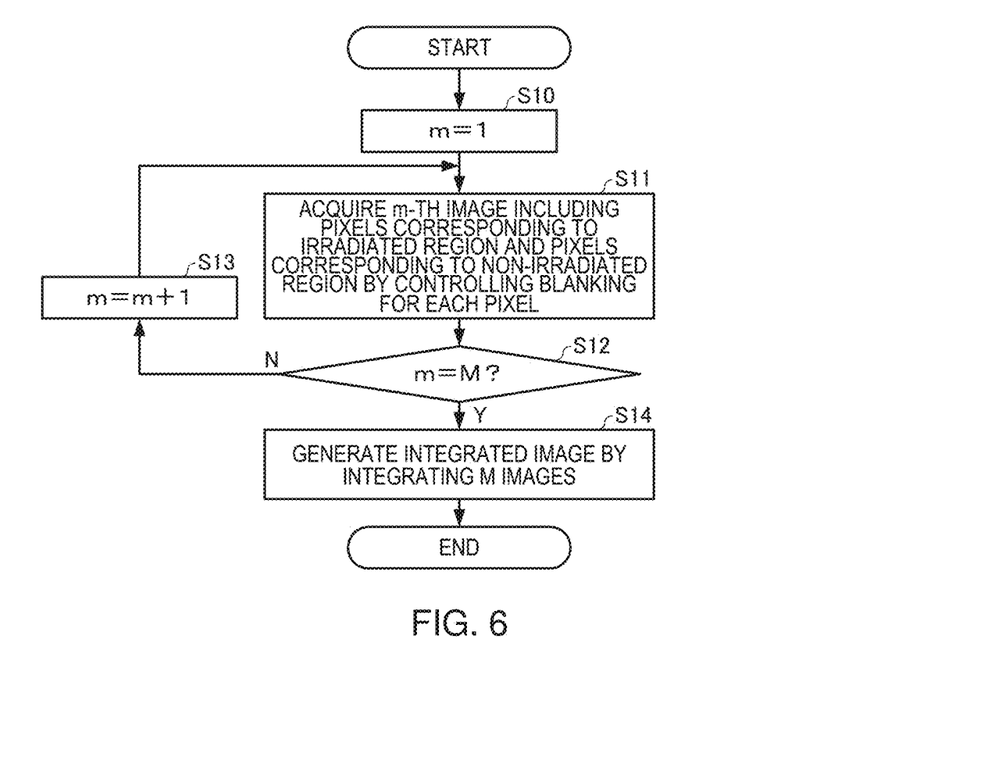
FIG. 6 is a flowchart illustrating a flow of processing performed by a processing unit.

Next, an example of the processing performed by the processing unit 100 will be described using a flowchart illustrated in FIG. 6. First, the image acquisition unit 102 sets a variable m at 1 (step S10) and then controls blanking by the blanker 12 for each pixel during the scan performed by the electron beam EB so as to acquire an m-th image constituted by pixels corresponding to the irradiated region and pixels corresponding to the non-irradiated region (step S11). Here, with the method of the first embodiment, the m-th image is acquired by performing a scan under a setting by which blanking is switched ON/OFF in units of one or a plurality of pixels, for example, within one horizontal scanning line. At this time, measures are taken to ensure that the regions corresponding to the irradiated region on first to m−1-th images do not overlap the region corresponding to the irradiated region on the m-th image. Alternatively, with the method of the second embodiment, the m-th image is acquired by performing a scan while ON/OFF-controlling blanking randomly for each pixel in the scanning region. Next, the image acquisition unit 102 determines whether or not the variable m has reached M (M being the total number of images to be acquired; for example, when irradiation is performed at a ratio of 1 in n pixels, M=n) (step S12), and when the variable m has not reached M (N in step S12), 1 is added to the variable m (step S13), whereupon the processing advances to step S11. When the variable m has reached M (Y in step S12), the integrated image generation unit 104 generates an integrated image by integrated the acquired M images (step S14).

The invention is not limited to the above-described embodiments, and various modifications can be made thereto. The invention includes configurations that are substantially the same (for example, in functions, methods, and results, or in objectives and effects) as the configurations described in the embodiments. The invention also includes configurations obtained by replacing non-essential elements of the configurations described in the embodiments with other elements. The invention also includes configurations having the same effects as those of the configurations described in the embodiments, or configurations capable of achieving the same objectives as those of the configurations described in the embodiments. The invention further includes configurations obtained by adding known art to the configurations described in the embodiments.

Embodiments of the invention have been described in detail above, but a person skilled in the art will readily appreciate that various modifications can be made from the embodiments without materially departing from the novel teachings and effects of the invention. Accordingly, all such modifications are assumed to be included in the scope of the invention.

The invention claimed is:

1. A charged particle beam device that scans a specimen with a charged particle beam and generates an image based on a detected signal from a detector that detects a signal generated from the specimen based on the scan performed by the charged particle beam, the charged particle beam device comprising:
   a blanker that performs blanking of the charged particle beam;
   an image acquisition unit that sets a duty ratio of the blanking, and acquires a plurality of images by controlling the blanking during the scan performed by the charged particle beam according to the set duty ratio, the plurality of images including pixels corresponding to a region of the specimen that is irradiated with the charged particle beam and pixels corresponding to a region of the specimen that is not irradiated with the charged particle beam; and
   an integrated image generation unit that generates an integrated image by integrating the plurality of acquired images,
   wherein the image acquisition unit increases a dose of the charged particle beam used when acquiring the plurality of images in proportion to the number of images to be acquired.

2. The charged particle beam device according to claim 1, wherein the image acquisition unit controls the blanking for each pixel.

3. The charged particle beam device according to claim 2, wherein the image acquisition unit controls the blanking randomly for each pixel.

4. The charged particle beam device according to claim 1, wherein the image acquisition unit acquires a plurality of images comprising: regions of the plurality of images respectively corresponding to different regions of the specimen that are irradiated with the charged particle beam; and regions of the plurality of images respectively corresponding to different regions of the specimen that are not irradiated with the charged particle beam.

5. The charged particle beam device according to claim 1, wherein the blanker is an electrostatic shutter.

6. An image generation method for scanning a specimen with a charged particle beam and generating an image based on a detected signal from a detector that detects a signal generated from the specimen based on the scan performed by the charged particle beam, the image generation method comprising:
   an image acquisition step of setting a duty ratio of blanking performed on the charged particle beam by a blanker, and acquiring a plurality of images by controlling blanking performed on the charged particle beam by a blanker during the scan performed by the charged particle beam, the plurality of images including pixels corresponding to a region of the specimen that is irradiated with the charged particle beam and pixels corresponding to a region of the specimen that is not irradiated with the charged particle beam; and
   an integrated image generating step of generating an integrated image by integrating the plurality of acquired images,
   wherein a dose of the charged particle beam used when acquiring the plurality of images is increased in proportion to the number of images to be acquired.

* * * * *